United States Patent
Tajalli

(10) Patent No.: US 9,148,087 B1
(45) Date of Patent: Sep. 29, 2015

(54) SYMMETRIC IS LINEAR EQUALIZATION CIRCUIT WITH INCREASED GAIN

(71) Applicant: Kandou Labs SA, Lausanne (CH)

(72) Inventor: Armin Tajalli, Chavannes pres Renens (CH)

(73) Assignee: KANDOU LABS, S.A. (CH)

( * ) Notice: Subject to any disclaimer, the term of this patent is extended or adjusted under 35 U.S.C. 154(b) by 0 days.

(21) Appl. No.: 14/280,305

(22) Filed: May 16, 2014

(51) Int. Cl.
| | |
|---|---|
| *H03F 3/191* | (2006.01) |
| *H03F 1/02* | (2006.01) |
| *H03G 3/00* | (2006.01) |
| *H03F 3/16* | (2006.01) |
| *H03M 7/00* | (2006.01) |

(52) U.S. Cl.
CPC ............... *H03F 1/0205* (2013.01); *H03F 3/16* (2013.01); *H03G 3/00* (2013.01); *H03M 7/00* (2013.01); *H03F 2200/366* (2013.01)

(58) Field of Classification Search
CPC ... H03F 1/0205; H03F 3/16; H03F 2200/366; H03G 3/00; H03G 1/0023; H03G 5/025; H03M 7/00
USPC .................. 330/252–254, 260, 292, 302, 304
See application file for complete search history.

(56) References Cited

U.S. PATENT DOCUMENTS

| | | | |
|---|---|---|---|
| 4,206,316 A | 6/1980 | Burnsweig | |
| 5,053,974 A | 10/1991 | Penz | |
| 5,166,956 A | 11/1992 | Baltus et al. | |
| 5,412,689 A | 5/1995 | Chan et al. | |
| 5,511,119 A | 4/1996 | Lechleider | |
| 5,553,097 A | 9/1996 | Dagher | |
| 5,995,016 A | 11/1999 | Perino | |
| 6,005,895 A | 12/1999 | Perino et al. | |
| 6,359,931 B1 | 3/2002 | Perino et al. | |
| 6,404,820 B1 | 6/2002 | Postol | |
| 6,504,875 B2 | 1/2003 | Perino et al. | |
| 6,509,773 B2 | 1/2003 | Buchwald et al. | |
| 6,556,628 B1 | 4/2003 | Poulton | |
| 6,563,382 B1 | 5/2003 | Yang | |
| 6,621,427 B2 | 9/2003 | Greenstreet | |
| 6,624,699 B2 * | 9/2003 | Yin et al. | 330/260 |
| 6,661,355 B2 | 12/2003 | Cornelius et al. | |
| 6,664,853 B1 * | 12/2003 | Sun et al. | 330/253 |
| 6,766,342 B2 | 7/2004 | Kechriotis | |
| 6,839,429 B1 | 1/2005 | Gaikwald et al. | |

(Continued)

FOREIGN PATENT DOCUMENTS

WO 2010031824 3/2010

OTHER PUBLICATIONS

Poulton, John W., et al., "Multiwire Differential Signaling", Revision 1.1, dated Aug. 5, 2003, 20 pages.

(Continued)

*Primary Examiner* — Khai M Nguyen
(74) *Attorney, Agent, or Firm* — Invention Mine LLC

(57) ABSTRACT

Circuits providing low noise amplification with continuous time linear equalization are described. An exemplary circuit includes four amplification elements, such as MOS transistors. The amplification elements are arranged in differential pairs, and the differential pairs are cross-coupled with a frequency-dependent coupling, such as a capacitive coupling, to enhance high-frequency gain. The outputs of the amplification elements are combined to provide an output representing inverted and un-inverted sums of differences in the input signals.

19 Claims, 10 Drawing Sheets

(56) References Cited

U.S. PATENT DOCUMENTS

| | | | |
|---|---|---|---|
| 6,870,404 B1 * | 3/2005 | Maangat | 327/65 |
| 6,999,516 B1 | 2/2006 | Rajan | |
| 7,164,631 B2 | 1/2007 | Tateishi | |
| 7,167,019 B2 | 1/2007 | Broyde et al. | |
| 7,176,759 B2 * | 2/2007 | Joos et al. | 330/253 |
| 7,180,949 B2 | 2/2007 | Kleveland et al. | |
| 7,184,483 B2 | 2/2007 | Rajan | |
| 7,358,869 B1 | 4/2008 | Chiarulli et al. | |
| 7,362,130 B2 | 4/2008 | Broyde et al. | |
| 7,362,174 B2 * | 4/2008 | Cao | 330/253 |
| 7,562,108 B2 * | 7/2009 | Singh et al. | 708/819 |
| 7,598,788 B2 * | 10/2009 | Cao | 327/266 |
| 7,598,811 B2 * | 10/2009 | Cao | 330/304 |
| 7,656,321 B2 | 2/2010 | Wang | |
| 7,683,720 B1 * | 3/2010 | Yehui et al. | 330/311 |
| 7,706,524 B2 | 4/2010 | Zerbe | |
| 7,746,764 B2 | 6/2010 | Rawlins et al. | |
| 7,933,770 B2 | 4/2011 | Kruger et al. | |
| 7,961,050 B1 * | 6/2011 | Swei et al. | 330/304 |
| 8,050,332 B2 | 11/2011 | Chung | |
| 8,055,095 B2 | 11/2011 | Palotai | |
| 8,091,006 B2 | 1/2012 | Prasad et al. | |
| 8,159,375 B2 | 4/2012 | Abbasfar | |
| 8,159,376 B2 | 4/2012 | Abbasfar | |
| 8,228,976 B2 * | 7/2012 | Hsiao et al. | 375/232 |
| 8,279,094 B2 | 10/2012 | Abbasfar | |
| 8,365,035 B2 | 1/2013 | Hara | |
| 8,443,223 B2 | 5/2013 | Abbasfar | |
| 8,593,305 B1 | 11/2013 | Tajalli | |
| 8,604,879 B2 * | 12/2013 | Mourant et al. | 330/260 |
| 8,649,445 B2 | 2/2014 | Cronie et al. | |
| 2009/0212861 A1 | 8/2009 | Lim | |
| 2010/0180143 A1 | 7/2010 | Ware et al. | |
| 2010/0189186 A1 | 7/2010 | Zerbe | |
| 2010/0215118 A1 | 8/2010 | Ware et al. | |
| 2010/0309964 A1 | 12/2010 | Oh et al. | |
| 2011/0029801 A1 | 2/2011 | Abbasfar | |
| 2011/0051854 A1 | 3/2011 | Kizer et al. | |
| 2011/0268225 A1 | 11/2011 | Cronie | |
| 2011/0299555 A1 | 12/2011 | Cronie et al. | |
| 2011/0302478 A1 | 12/2011 | Cronie | |
| 2013/0051162 A1 | 2/2013 | Amirkhany et al. | |
| 2014/0254642 A1 | 9/2014 | Holden | |

OTHER PUBLICATIONS

Abbasfar, A., "Generalized Differential Vector Signaling," IEEE International Conference on Communications, ICC '09, Jun. 14, 2009, pp. 1-5.

Dasilva, et al. "Multicarrier Orthogonal CDMA Signals for Quasi-Synchronous Communication Systems," IEEE Journal on Selected Areas in Communications, Jun. 1, 1994, vol. 12, No. 5, pp. 842-852.

Slepian, D., "Permutation Modulation", Proceedings of the Institute of Electrical Engineers, Institution of Electrical Engineers. Stevenage, GB, Mar. 1, 1965, vol. 53, No. 3, pp. 228-236.

Stan, M. et al., "Bus-Invert Coding for Low-power I/O", 1995, IEEE Transactions on VLSI systems, vol. 3, No. 1, pp. 49-50.

Tallini, L., et al. Transmission Time Analysis for the Parallel Asynchronous Communication Scheme: 2003, IEEE Transactions on Computers, vol. 52, No. 5, pp. 558-571.

Wang, X. et al., "Applying CDMA Technique to Network-on-chip," IEEE Transactions on Very Large Scale Integration (VLSI) Systems, Oct. 1, 2007, vol. 15, No. 10, pp. 1091-1100.

International Search Report mailed Nov. 5, 2012, in International Patent Application S.N. PCT/EP2012/052767.

International Search Report mailed Jul. 14, 2011 in International Patent Application S.N. PCT/EP2011/002170.

* cited by examiner

SYMMETRIC IS LINEAR EQUALIZATION CIRCUIT WITH INCREASED GAIN

REFERENCES

The following references are herein incorporated by reference in their entirety for all purposes:

U.S. Patent Publication No. 2011/0268225 of U.S. patent application Ser. No. 12/784,414, filed May 20, 2010, naming Harm Cronie and Amin Shokrollahi, entitled "Orthogonal Differential Vector Signaling" (hereinafter "Cronie I");

U.S. Patent Publication No. 2011/0302478 of U.S. patent application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II");

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III");

U.S. Provisional Patent Application No. 61/753,870, filed Jan. 17, 2013, naming John Fox, Brian Holden, Peter Hunt, John D Keay, Amin Shokrollahi, Richard Simpson, Anant Singh, Andrew Kevin John Stewart, and Giuseppe Surace, entitled "Methods and Systems for Chip-to-chip Communication with Reduced Simultaneous Switching Noise" (hereinafter called "Fox I");

U.S. Provisional Patent Application No. 61/763,403, filed Feb. 11, 2013, naming John Fox, Brian Holden, Ali Hormati, Peter Hunt, John D Keay, Amin Shokrollahi, Anant Singh, Andrew Kevin John Stewart, Giuseppe Surace, and Roger Ulrich, entitled "Methods and Systems for High Bandwidth Chip-to-Chip Communications Interface" (hereinafter called "Fox II");

U.S. Provisional Patent Application No. 61/773,709, filed Mar. 6, 2013, naming John Fox, Brian Holden, Peter Hunt, John D Keay, Amin Shokrollahi, Andrew Kevin John Stewart, Giuseppe Surace, and Roger Ulrich, entitled "Methods and Systems for High Bandwidth Chip-to-Chip Communications Interface" (hereinafter called "Fox III");

U.S. Provisional Patent Application No. 61/812,667, filed Apr. 16, 2013, naming John Fox, Brian Holden, Ali Hormati, Peter Hunt, John D Keay, Amin Shokrollahi, Anant Singh, Andrew Kevin John Stewart, and Giuseppe Surace, entitled "Methods and Systems for High Bandwidth Communications Interface" (hereinafter called "Fox IV");

U.S. patent application Ser. No. 13/542,599, filed Jul. 5, 2012, naming Armin Tajalli, Harm Cronie, and Amin Shokrollahi entitled "Methods and Circuits for Efficient Processing and Detection of Balanced Codes" (hereafter called "Tajalli I".)

U.S. patent application Ser. No. 13/842,740, filed Mar. 15, 2013, naming Brian Holden, Amin Shokrollahi, and Anant Singh, entitled "Methods and Systems for Skew Tolerance in and Advanced Detectors for Vector Signaling Codes for Chip-to-Chip Communication" (hereinafter called "Holden I")

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences" (hereinafter called "Ulrich I").

FIELD OF THE INVENTION

The present invention relates to communications systems circuits generally, and more particularly to the amplification, equalization, and frequency compensation of signal receivers for high-speed multi-wire serial interfaces used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods as described in Cronie I, Cronie II, and Cronie III have been proposed to further optimize the trade-offs between power consumption, pin efficiency and noise robustness of chip-to-chip communication systems. In those vector signaling systems, the digital information is transformed into a different representation space in the form of a vector codeword that is chosen in order to optimize the power consumption, pin-efficiency and speed trade-offs based on the transmission channel properties and communication system design constraints.

BRIEF DESCRIPTION

Communications signal receiver circuits providing amplification and frequency compensation are described, incorporating particular design features providing increased signal gain without increased noise, thus an increased signal-to-noise or SNR ratio. Certain embodiments also provide improved signal dynamic range and linearity. In some applications the potential gain increase may be traded off for extended bandwidth, support for support additional signal inputs, and/or lower power.

DETAILED DESCRIPTION

A receiver for vector signaling encoded information accepts multiple wire inputs corresponding to the multiple components of a codeword. Commonly, different voltage, current, etc. levels are used for signaling and more than two levels might be used to represent each codeword element, such as a ternary signaling code wherein each wire signal has one of three values. Receivers may incorporate amplification, frequency-dependent amplification, signal conditioning, and filtering such as obtained with the continuous time linear equalization or "CTLE" filtering method. These functions may be embodied individually, or combined into multifunction circuits. As will be shown, such multifunction circuits may reduce power consumption, facilitate improved signal to noise ratio, increase circuit dynamic range, and/or enable higher speed signaling.

In accordance with at least one embodiment of the invention, circuits are described for the efficient equalization and pre-sample-processing of vector signal coded data transmitted over physical channels such that the signals are resilient to common mode noise, do not require a common reference at the transmission and reception points, and can produce a higher pin efficiency than conventional differential signaling with relatively low power dissipation for encoding and decoding.

In a practical embodiment, signals may undergo significant change in amplitude, waveform, and other characteristics between transmitter and receiver, due to the transmission characteristics of communications channel. Using one contemporary embodiment as an example, 400 mV amplitude signals at the transmitter may be attenuated by the channel to less than 20 mV at the receiver, with significantly greater attenuation at higher frequencies resulting in slow signal transitions and other distortions. At these low signal amplitudes, receiver noise becomes a significant issue, with the inherent noise level of the first amplifier stage often constraining the achievable signal-to-noise ratio of the overall system. Receiver dynamic range is also significant, as the same receiver design expected to operate with high attenuation signal paths may also be used with extremely short and thus low attenuation connections.

Basic MOS Amplifier Characteristics

Figure 1A:
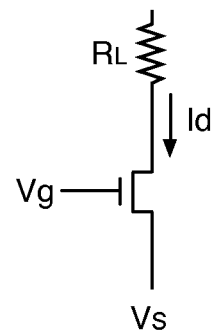
FIGS. 1A, 1B, and 1C show example prior art circuits illustrating the basic elements of single-ended signal amplification, differential signal amplification, and differential amplification with linear frequency-dependent equalization, respectively.
Figure 1B:
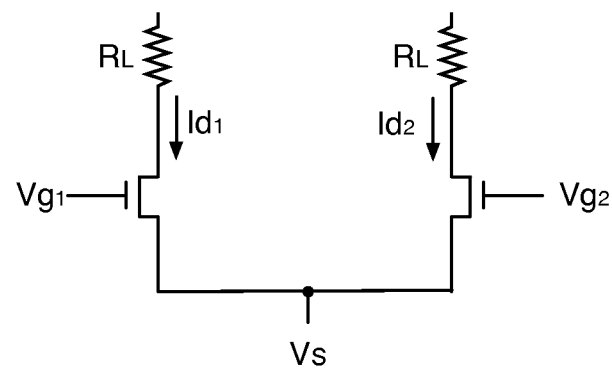
Figure 1C:
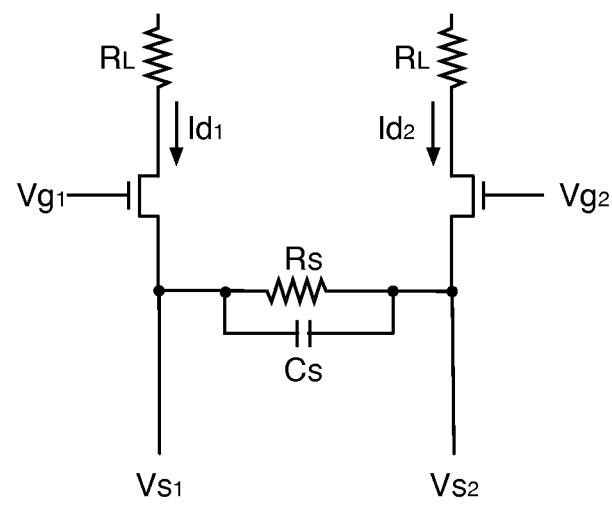

The basic characteristics of MOS transistor amplifiers as illustrated in FIGS. 1A, 1B, and 1C are well known. FIG. 1A illustrates a model of the basic operation of a MOS transistor amplifier. Supplied with source current Id from a load impedance $R_L$, a transistor with transconductance gm may achieve a small-signal gain of $gm \times R_L$, barring any secondary circuit effects. If the inherent noise of the transistor is nrms (in RMS voltage units,) the effective signal-to-noise ratio or SNR is thus $gm \times R_{L/nrms}$ and the current consumption is Id.

In a differential configuration such as shown in FIG. 1B, the amplification is $gm \times R_L \times (Vg_1 - Vg_2)$ and the noise is $\sqrt{2} \times nrms$, leading to a SNR of $$gm \times R_L / \sqrt{2} \times nrms$$

with a current consumption of 2×Id.

FIG. 1C shows a known CTLE model of a differential amplifier circuit. Its noise characteristics and maximum achievable gain remain unchanged from the basic differential amplifier model of FIG. 1B, but the introduction of the parallel Rs and Cs combination between the transistor sources introduces a frequency-dependent gain characteristic, with gain at low frequencies considerably reduced compared to the gain at high frequencies, which approaches the maximum achievable gain value. Other examples of CTLE amplifier circuits may be found in Tajalli I.

Figure 2A:
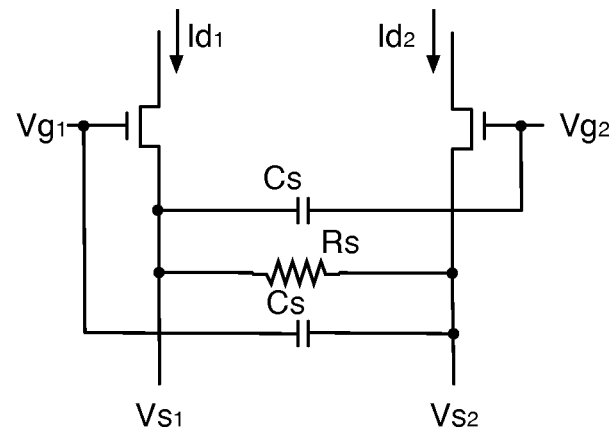
FIGS. 2A and 2B illustrate aspects of the invention, with FIG. 2A showing the basic elements of the design and FIG. 2B providing an embodiment of a differential amplifier with equalization.

FIG. 2A illustrates the behavior of a differential amplifier with CTLE behavior in accordance with at least one aspect of the invention. Input nodes $Vg_1$ and $Vg_2$ are coupled not only to the transistor gates, but also via capacitors Cs to the source of the opposing pair's transistor. Effectively, each transistor thus provides both common-source-mode amplification of its gate input signal, while simultaneously providing common-gate-mode amplification of the other input signal, resulting in a doubling of the effective gain. In this new configuration, the maximum achievable amplification is thus $2 \times gm \times R_L$ while the uncorrelated noise for the transistor pair is $\sqrt{2} \times nrms$, leading to a SNR of $$\sqrt{2} \times gm \times R_L / nrms$$

with a current consumption of 2×Id. Thus, the model of FIG. 2A has twice the gain and two times better SNR with the same current consumption, compared to the known art configuration of FIG. 1C.

Figure 2B:
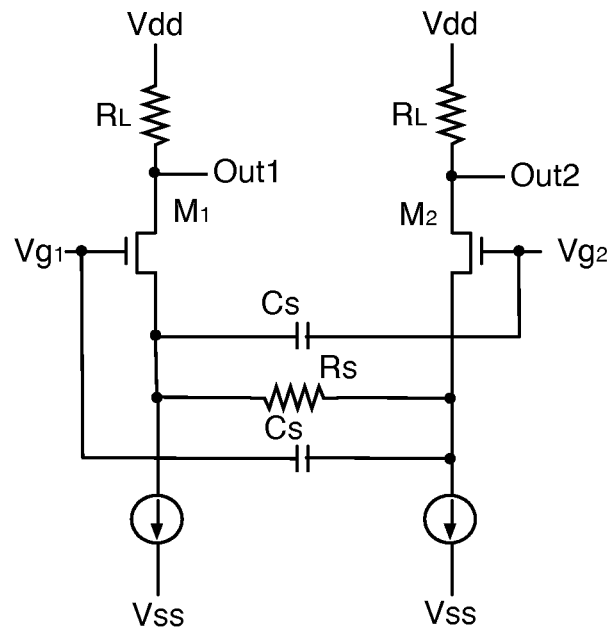

A practical embodiment of FIG. 2A is shown in the schematic of FIG. 2B. Differential output signals Out1 and Out2 are developed across output resistors $R_L$, with the current sinks at each transistor source setting operating current for the differential transistor pair.

FIG. 2B illustrates an exemplary circuit for CTLE of analog signals. As illustrated in FIG. 2B, the circuit includes a first amplification element M1 and a second amplification element M2. The first and second amplification elements are arranged in a differential configuration, such as a long-tailed pair, and they preferably have matched characteristics. The amplification elements each have an inverting input and a non-inverting input. In the example of FIG. 2B, the inverting input is the gate of each transistor, and the non-inverting input is the source of that transistor. A signal at the transistor gate is amplified in a common source configuration, and a signal at the transistor source is amplified in a common gate configuration.

A first signal input is provided at an input node $Vg_1$ with a direct connection to the inverting input of the first amplification element M1, and a second signal input is provided at an input node $Vg_2$ with a direct connection to the inverting input of the second amplification element M2. There is also a frequency-dependent connection from the first signal input $Vg_1$ to the non-inverting input of the second amplification element M2. This frequency-dependent connection is made through a series capacitor with capacitance Cs. In addition, there is another frequency-dependent connection from the second signal input $Vg_2$ to the non-inverting input of the first amplification element M1. This frequency-dependent connection is also made through a series capacitor with capacitance Cs. These frequency-dependent connections increase the gain of the differential amplification provided by the first and second amplification elements, particularly at high frequencies.

In an alternative embodiment (not illustrated), the roles of the inverting and non-inverting inputs of the amplification elements are reversed. In such an embodiment, the first signal input $Vg_1$ is provided with a direct connection to the non-inverting input of the first amplification element M1, and a second signal input $Vg_2$ is provided with a direct connection to the non-inverting input of the second amplification element M2. There is also a frequency-dependent connection from the first signal input $Vg_1$ to the inverting input of the second amplification element M2, and another frequency-dependent connection from the second signal input $Vg_2$ to the inverting input of the first amplification element M1. Thus, the frequency-dependent connections utilize the opposite amplification element input from the direct connections, resulting in increased gain.

The frequency-dependent CTLE characteristics may be computed in a similar manner as with a conventional CTLE design. Generally, Cs in an embodiment such as shown in FIG. 2B will be approximately twice as large as Cs in a conventional embodiment such as that of FIG. 1C. The additional input capacitance of the transistor gate paralleled with Cs may be an issue in some applications, but is generally tractable for typical values of input impedance and CTLE pole-zero frequency. In one system design using the new embodiment, increased gains of 3-6 dB were seen over conventional designs depending on the characteristics of external circuitry. It will be apparent to one familiar with the art that, as with known equalization circuits, the frequency-determining Cs/Rs combination may be extended to networks of multiple pole-zero pairs, and that one or more of the frequency-determining elements may be represented by effective circuit impedance at a node, parasitic capacitance at a node, etc.

Extensions to Support ENRZ

Ensemble NRZ (also know as ENRZ or H4 code) is a proprietary vector signaling code providing significant benefits over conventional NRZ and differential pair operation. As described in [Fox IV], ENRZ encodes three bits of information over four wires, using all possible permutations of the signal vectors (+1, −⅓, −⅓, −⅓) and (−1, +⅓, +⅓, +⅓). Thus, ENRZ is a balanced quaternary code, although any single codeword uses only two of the four possible signal levels. The balanced codewords give ENRZ desirable pseudo-differential characteristics, including low SSO noise, induced noise immunity, and reference-less receiver operation.

The [Ulrich I] reference describes use of extended differential amplifier circuits to perform analog computations on vector signaling code signals as part of code detection. Analog computation circuits for decoding ENRZ vector codes perform calculations of the form shown in Equation 1 where J, K, L, M are variables representing the symbol values of the four input signals values.

$$R=(J+L)-(K+M) \tag{Eqn. 1}$$

It may be noted that applying three instances of Equation 1 with different permutations of receive signal input values to the four variables is sufficient to detect each code word of ENRZ. As one example and without limitation, the input permutations producing the three results $R_0$, $R_1$, $R_2$ based on Equations 2, 3 and 4 are sufficient to unambiguously identify each code word of vector signaling code ENRZ as represented by receive signal input values A, B, C, D. As these equations describe linear combinations using only sums and differences, it will be apparent that other equivalent equations, as one example presenting a sum of two differences, may be produced using normal arithmetic factoring and grouping operations.

$$R_0=(A+C)-(B+D) \tag{Eqn. 2}$$

$$R_1=(C+D)-(A+B) \tag{Eqn. 3}$$

$$R_2=(C+B)-(D+A) \tag{Eqn. 4}$$

Architecturally, it is convenient to perform such detection operations at or near the receiver input, and high speed capability requires an efficient, high performance embodiment. In accordance with at least one aspect of the invention, a two input differential input circuit such as shown in FIG. 2B may be extended to provide such analog computation capability suitable for ENRZ detection or detection of other vector signaling codes with similar characteristics.

Figure 3A:
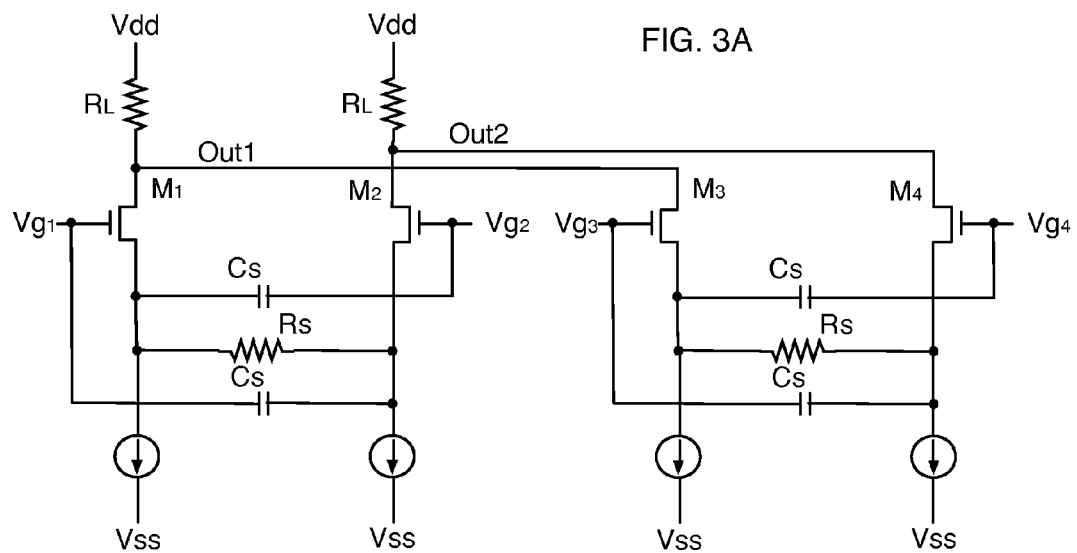
FIGS. 3A and 3B show respective embodiments using different approaches that extend the differential amplifier with equalization to support the four signals of an ENRZ vector signaling code receiver.

The embodiment illustrated in FIG. 3A incorporates two distinct instances of the differential input stages of FIG. 2B, with paralleled input pairs M1/M2 and M3/M4 each accepting two inputs, $Vg_1/Vg_2$ and $Vg_3/Vg_4$ respectively, using the direct plus capacitive input method of the previous example on each of the four inputs. As each differential pair computes the analog difference of its inputs, and paralleling two such pairs with a common load results in an output representing the sum of the two differential pair signals, the resulting outputs Out1 and Out2 represent the uninverted and inverted results of the equation $$(Vg_1-Vg_2)+(Vg_3-Vg_4)$$

In this first ENRZ configuration, the maximum amplification is $2 \times gm \times R_L$ and the noise is $2 \times nrms$, leading to a SNR of $gm \times R_L/nrms$ with a current consumption of $4 \times Id$. Compared to well-known ENRZ CTLE circuits, the embodiment of FIG. 3A has twice the gain and $\sqrt{2}$ better SNR with the same current consumption.

Thus, in the example of FIG. 3A, a circuit includes a first amplification element (M1) and a second amplification element (M2) with matched characteristics in a differential configuration, and a third amplification element (M3) and a fourth amplification element with matched characteristics in a differential configuration. Each of these amplification elements has a first input (e.g., the gate) and a second input (e.g., the source). A first load impedance (e.g., a resistor with resistance RL) is shared by the first amplification element and third amplification element, and an output node Out1 is provided for obtaining a signal at the first load impedance. A second load impedance is shared by the second amplification element and fourth amplification element, and an output node Out2 is provided for obtaining a signal at the second load impedance. A first signal input $Vg_1$, second signal input $Vg_2$, third signal input $Vg_3$, and fourth signal input $Vg_4$, each directly connect to a first input of the corresponding first, second, third, and fourth amplification elements, respectively. There is also a frequency-dependent connection of the first, second, third, and fourth signal inputs to the second input of the second, first, fourth, and third amplification elements, respectively. Through these connections, the signal obtained at the first and second load impedances represents inverted and non-inverted sums of differences of the input signals.

Figure 3B:
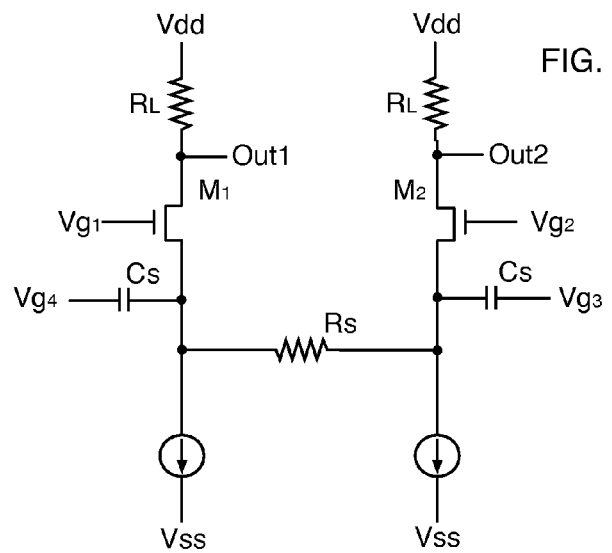

An alternative embodiment providing equivalent ENRZ CTLE functionality is illustrated in FIG. 3B, where two inputs $Vg_1$ and $Vg_2$ are connected to the gates of transistors M1 and M2, while the second two inputs $Vg_3$ and $Vg_4$ are connected via input capacitors Cs to the sources of transistors $M_2$ and $M_1$. In this alternative ENRZ configuration, the maximum amplification is $gm \times R_L$ and the noise is $\sqrt{2} \times$nrms, leading to a SNR of $$gm \times R_L / \sqrt{2} \times nrms$$

with a current consumption of 2×Id. Thus, the power consumption is half that of the embodiment of FIG. 3A. Compared to well-known ENRZ CTLE circuits, the embodiment of FIG. 3B has lower power consumption, reduced gain and noise, as well as a simpler circuit topology.

Figure 10:
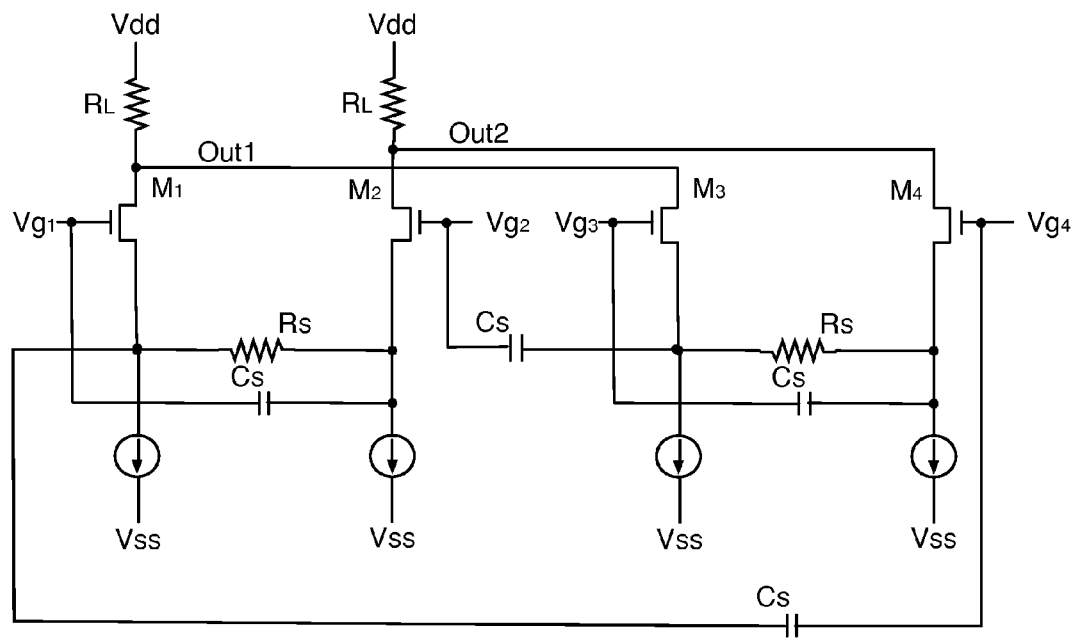
FIG. 10 illustrates an alternate embodiment of the circuit of FIG. 3A.

Another alternative embodiment providing equivalent ENRZ CLTE functionality is illustrated in FIG. 10, which has the same basic structure and performance characteristics as the circuit of FIG. 3A, but with the inputs via input capacitors Cs connecting to the same side of the other differential pair.

Figure 9:
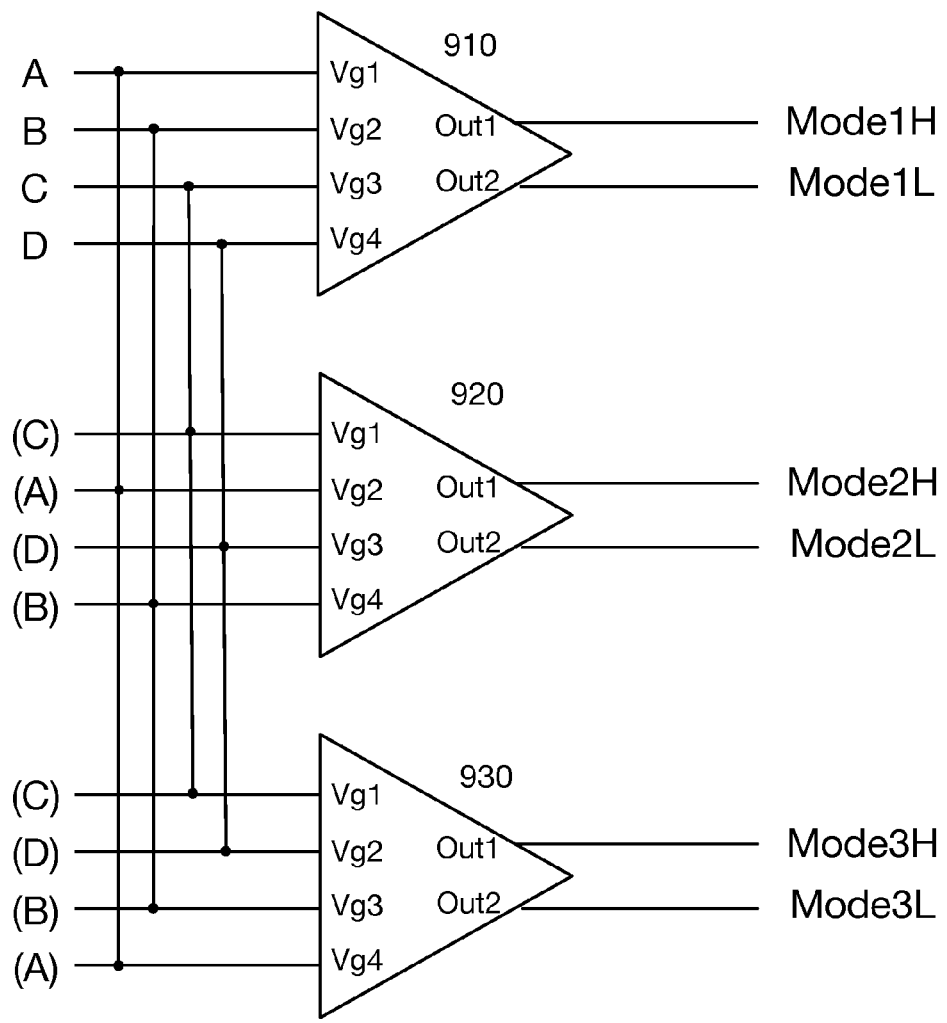
FIG. 9 shows a complete embodiment of an ENRZ detector, incorporating three instances of a ENRZ vector signaling code receiver as shown in FIG. 3A, FIG. 3B, or FIG. 8.

A system embodiment of an ENRZ detector using three instances of the circuit of FIG. 3A is illustrated in FIG. 9. Each of identical ENRZ CTLE elements 910, 920, and 930 are as described in FIG. 3A. Inputs A, B, C, D are received wire signals from four wires carrying ENRZ signals, and are connected to 910, 920, and 930 as described by Equations 2, 3, and 4. For purposes of clarity, the permuted input signals A, B, C, and D are redundantly labeled to the left of elements 920 and 930 in parenthesis. Three sets of differential outputs Mode1H/Mode1L, Mode2H/Mode2L, and Mode3H/Mode3L are produced and in a preferred embodiment will represent the three bits of data encoded in the ENRZ signals.

Figure 8:
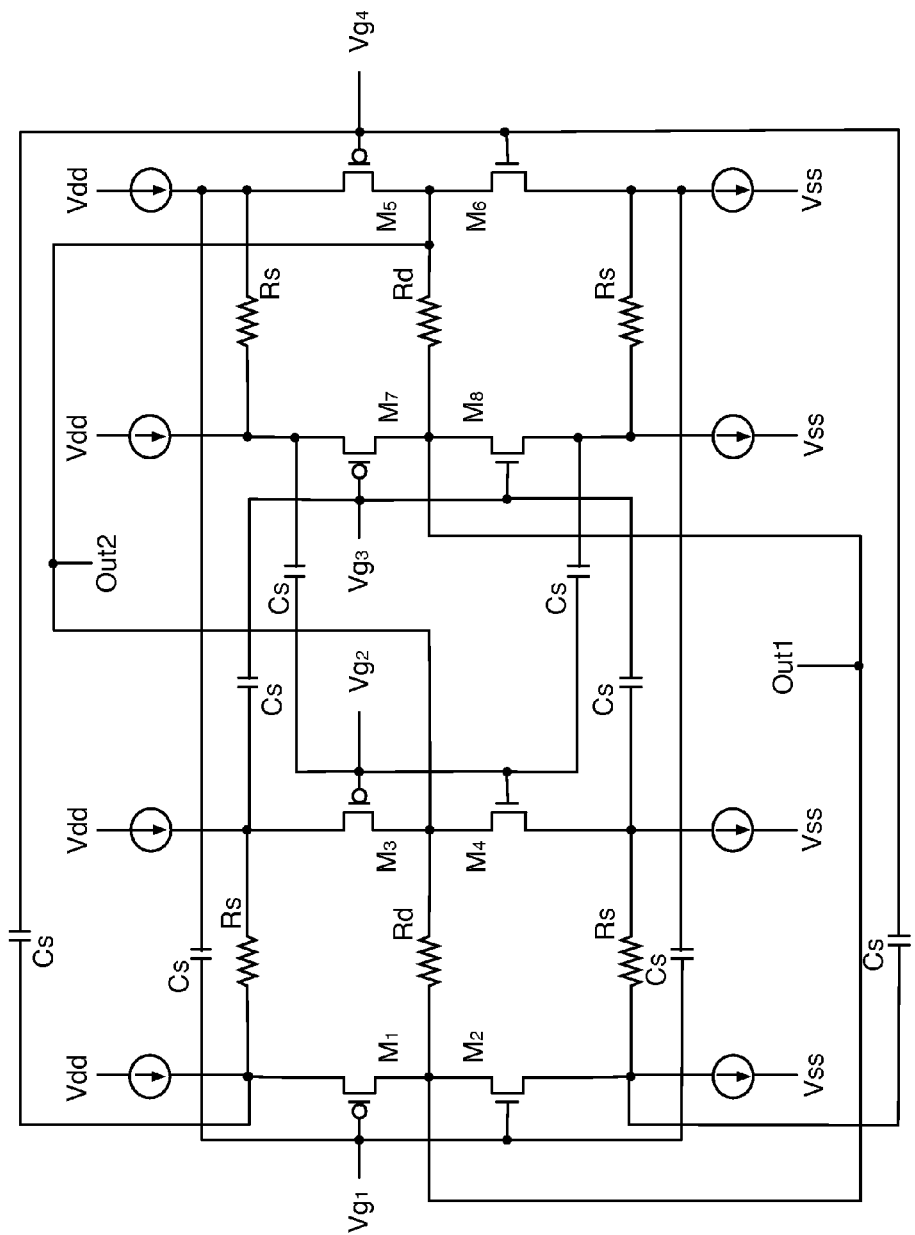
FIG. 8 illustrates a further embodiment extending the amplifier with equalization incorporating CMOS transistor pairs to support the four signals of an ENRZ vector signaling code receiver.

Equivalent embodiments may also be obtained by incorporating three identical instances of any of the circuits of FIG. 3B, FIG. 8 or FIG. 10 as elements 910, 920, and 930 of FIG. 9.

The circuit of FIG. 3B includes a first amplification element (M1) and a second amplification element (M2) with matched characteristics in a differential configuration. Each of these amplification elements has a first input and a second input, e.g. a gate and a source. A first load impedance, such as a resistor with resistance $R_L$, is provided for the first amplification element, and a second load impedance for the second amplification element. A first signal input node $Vg_1$ and a second signal input node $Vg_2$, are each directly connected to a first input of the corresponding first and second amplification elements. A third signal input $Vg_3$ is connected to the second input of the second amplification element, and a fourth signal input $Vg_4$ is connected to the second input of the first amplification element. The signal obtained at the output nodes Out1 and Out2 at the first and second load impedances represents inverted and non-inverted sums of differences of the input signals. One familiar with the art may note that the gain from inputs $Vg_1$ and $Vg_2$ can potentially differ from that from inputs $Vg_3$ and $Vg_4$ as the former are direct inputs to transistor gate inputs of common source amplifiers, while the latter are capacitively coupled to the transistor sources of common gate amplifiers. In practical embodiments this issue is moot, as these imbalances are quite small for typical input frequency ranges and CTLE frequency/gain profiles. Also, multiple iterations of the sum of difference computation are typically performed, as one example with different orderings of input signals as described by Equations 2, 3, and 4, and subsequent interpretation of these multiple results tends to mitigate any potential imbalance.

Figure 4:
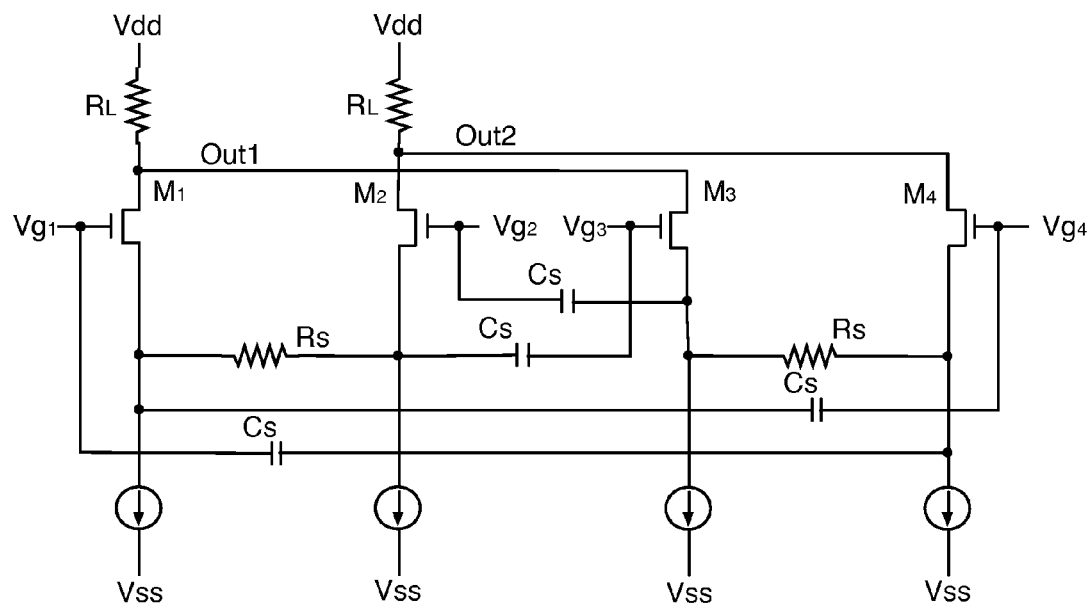
FIG. 4 illustrates a further embodiment extending the differential amplifier with equalization to support the four signals of an ENRZ vector signaling code receiver.

A further embodiment as shown in FIG. 4 illustrates an alternate topology providing both direct gate input and capacitively coupled source connection of each input signal. However, where the circuit of FIG. 3A made the latter connection to the transistor on the opposite side of the same differential pair, the circuit of FIG. 4 connects to the transistor on the opposite side of the other differential pair. This functionally equivalent but topologically distinct embodiment provides additional symmetry, which may facilitate layout and/or reduce potential circuit imbalances.

Complementary Gain Stages

Figure 5:
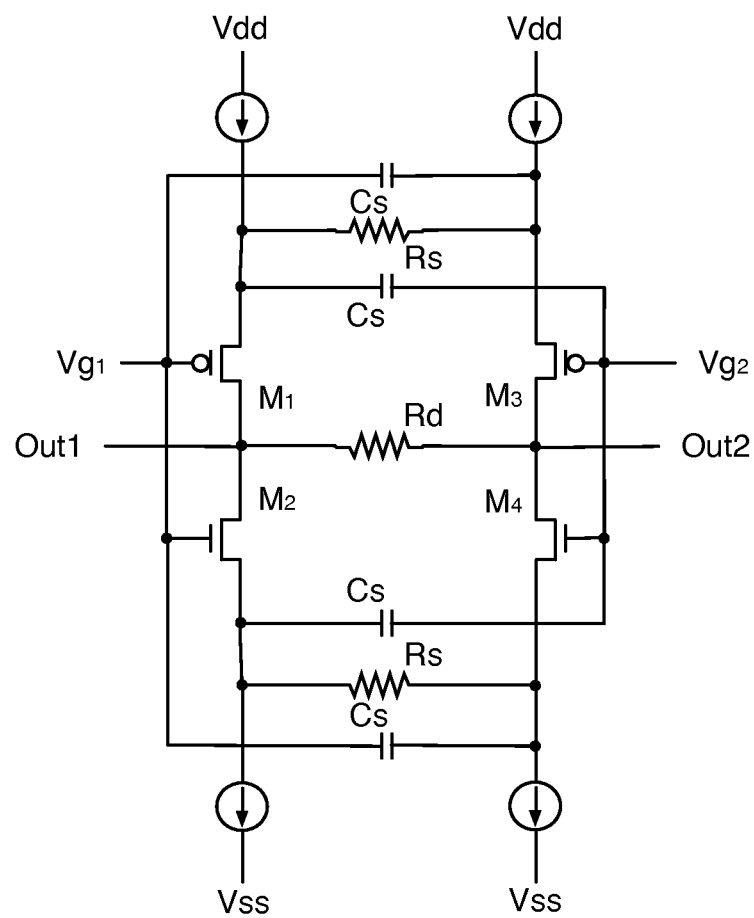
FIG. 5 shows an embodiment incorporating CMOS transistor pairs into the differential amplifier with equalization.

FIG. 5 shows another embodiment of a differential amplifier with equalization, where each of the amplification elements is a set of complimentary MOS (CMOS) transistors. In accordance with the earlier examples, each input connects not only to the differential transistor gates, but also via capacitors Cs to the opposing differential transistor's source or drain in a fully symmetric manner. Because of the complementary nature of the P- and N-channel transistors in each set, they both provide common source amplification of their gate input signals, with their output currents effectively in parallel. Thus, differential outputs Out1 and Out2 are developed across load resistor Rd. In typical designs, the value of Rd will be approximately twice the value of $R_L$ in the previous examples to obtain comparable gain. As with the previous designs, the combinations of Cs and Rs set the pole and zero frequencies of the CTLE function.

Although PMOS transistors may have poorer high-frequency characteristics than their equivalent NMOS transistors in some integrated circuit processes, this constraint does not provide an absolute limit on overall circuit performance. Overall frequency response of this circuit in a practical embodiment is approximately an interpolation between the native frequency characteristics of its component P- and N-MOS transistors, and those frequency characteristics are also much closer to parity in current integrated circuit processes.

This circuit has also been extensively analyzed for linearity issues, and has been found to be somewhat better than known art designs, where cutoff of one of the single input transistors introduces clipping.

Further Extensions

Figure 6:
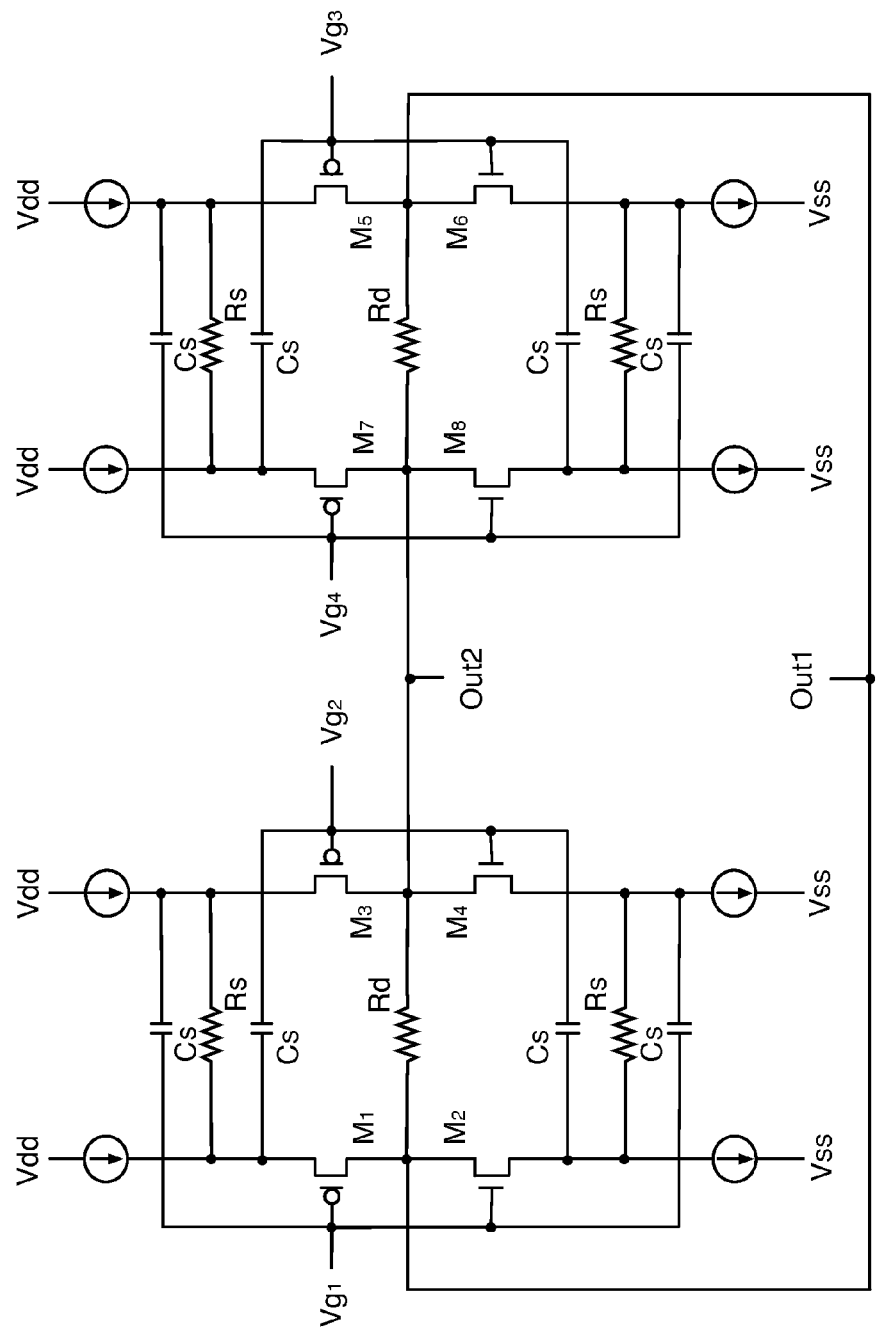
FIG. 6 illustrates an embodiment extending the amplifier with equalization incorporating CMOS transistor pairs to support the four signals of an ENRZ vector signaling code receiver.
Figure 7:
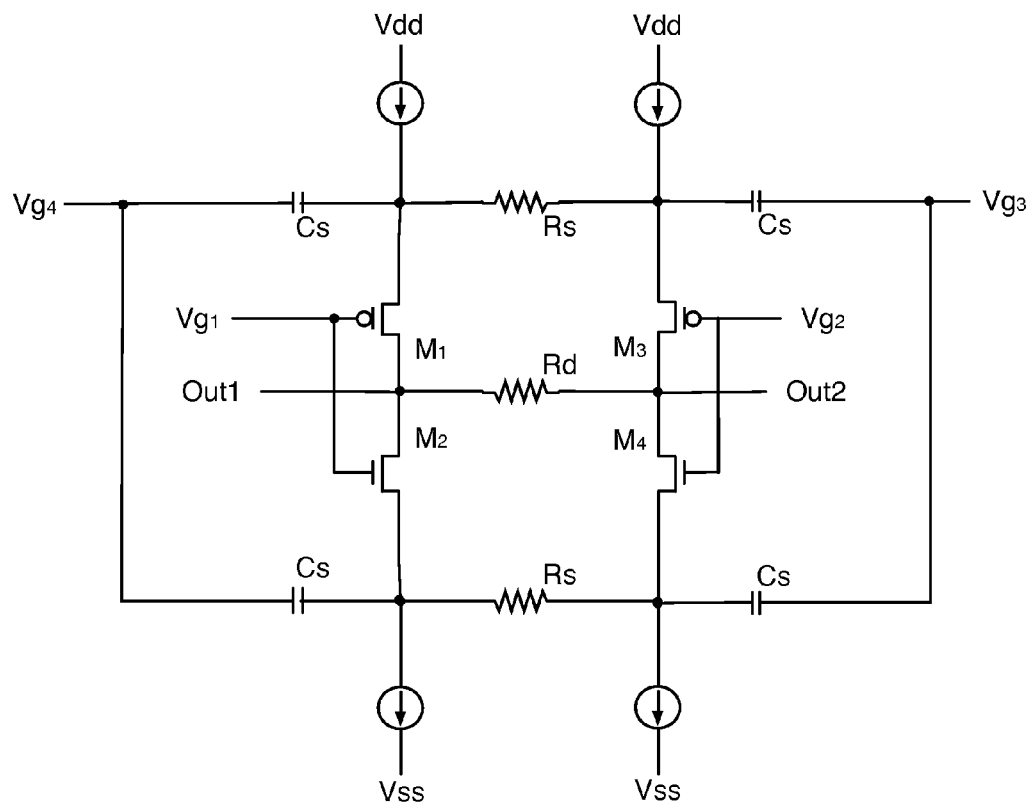
FIG. 7 illustrates a second embodiment extending the amplifier with equalization incorporating CMOS transistor pairs to support the four signals of an ENRZ vector signaling code receiver.

One familiar with the art will recognize that the same approaches previously shown in FIGS. 3A and 3B to extend the basic designs of FIGS. 2A and 2B to support ENRZ code may also be applied to the design of FIG. 5. One such embodiment is illustrated in FIG. 6, which applies the approach described in FIG. 3A to the circuit of FIG. 5 to support the four inputs of an ENRZ receiver. A second such embodiment is illustrated in FIG. 7, which applies the approach described in FIG. 3B to the circuit of FIG. 5 to support the four inputs of an ENRZ receiver.

A further embodiment shown in FIG. 8 combines the complementary transistor differential amplifiers of FIG. 5, the ENRZ detecting sum-of-differences computation of FIG. 3A, and the symmetrical cross-coupling of FIG. 4. In FIG. 8, a first amplification element is made up of a set M1/M2 of complementary MOS transistors, and a second amplification element is made up of a se M3/M4 of complementary MOS transistors. The first and second amplification elements have matched characteristics and are arranged in a differential configuration. A third amplification element is made up of a set M7/M8 of complementary MOS transistors, and a fourth amplification element is made up of a set M5/M6 of complementary MOS transistors. The third and fourth amplification elements have matched characteristics and are arranged in a differential configuration. Each of the first, second, third, and fourth amplification elements has a first input and a second input. For example, the first input of an amplification element may include one or more gates in a complementary MOS transistor pair, while the second input of an amplification pair may include one or more sources of the complementary MOS transistor pair. It should be noted that the terms "first input" and "second input" are mere labels of convenience, so the "first input" can be a transistor source, while the "second input" can be a transistor gate.

A first load impedance is shared by the first amplification element and third amplification element, and a second load impedance is shared by the second amplification element and fourth amplification element. First, second, third, and fourth signal input nodes ($Vg_1, Vg_2, Vg_3, Vg_4$, respectively) each are directly connected to a first input of the corresponding first, second, third, and fourth amplification elements, respectively. There is also a frequency-dependent connection of the first, second, third, and fourth signal inputs to the second input of the fourth, third, second, and first amplification elements, respectively. The signals obtained by the first output node Out1 at the first load impedance and by the second output node Out2 at the second load impedance represent inverted and non-inverted sums of differences of the input signals. Other known techniques for introducing frequency-dependent gain into an amplifier circuit are also directly applicable to the described embodiments. As one example, the load resistance described herein may optionally be comprised of a combination of resistance and inductance, or inductance alone, to provide additional high-frequency gain peaking or bandwidth extension.

The principles described herein may be extended to circuits employing various numbers of differential pairs and employing different topologies of frequency-dependent couplings. In some embodiments, an analog computation circuit includes at least two differential pairs of amplification elements. The amplification elements may include, for example, individual MOS transistors or CMOS amplifier pairs. Each of the amplification elements has an inverting input and a non-inverting input. In some embodiments, the inverting input is an input at a gate of an NMOS transistor, while the non-inverting input is an input at the source of the NMSOS transistor.

Each of the differential pairs of amplification elements includes a first amplification element and a second amplification element. The first amplification elements have outputs connected to a first differential summing output node, and the second amplification elements have outputs connected to a second differential summing output node. In some embodiments, the differential summing output nodes are connected to respective load impedance. In such embodiments, the voltage across the load resistor has a value that reflects of a sum of outputs of the connected amplification elements. In other embodiments, the differential summing output nodes could be connected to a current mirror or other circuitry adapted to provide an output that reflects a sum of the outputs of the connected amplification elements.

The analog computation circuit is further provided with a plurality of gain-enhancing couplings, such as capacitive couplings. These capacitive couplings fall under two groups: a first plurality and second plurality of gain-enhancing capacitive couplings. Each of the first plurality of gain-enhancing capacitive couplings connects the inverting input of one of the first amplification elements with the non-inverting input of one of the second amplification elements. Each of the second plurality of gain-enhancing capacitive couplings connects the inverting input of one of the second amplification elements with the non-inverting input of one of the first amplification elements. These couplings operate to enhance the gain of the analog computation circuit because each input is represented twice in the output of the analog computation circuit: first as an inverting input that reduces the output at one of the output nodes, and second (through the coupling) as a non-inverting input that increases the output at the opposite output node.

The gain-enhancing capacitive couplings can be connected in various arrangements. In some embodiments, each of first and second plurality of capacitive couplings is connected between amplification elements in the same differential pair, as illustrated in FIG. 3A and FIG. 6. In other embodiments, each of the first and second plurality of capacitive couplings is connected between amplification elements in different differential pairs. As illustrated in FIG. 4 and FIG. 8. In other embodiments, some of the capacitive couplings are connected within a differential pair and other capacitive couplings are connected across different differential pairs. In one such embodiment, the couplings are connected in a cyclic coupling configuration, as illustrated in FIG. 10.

Preferably, each of the inverting inputs is coupled with a unique non-inverting input. That is, each of the inverting inputs of the first amplification elements is connected through one of the first plurality of capacitive couplings with the non-inverting input of a respective second amplification element, and conversely, each of the inverting inputs of the second amplification elements is connected through one of the second plurality of capacitive couplings with the non-inverting input of a respective first amplification element.

The analog computation circuit further includes a plurality of signal input nodes. In some embodiments, each of the signal input nodes has a direct connection to the inverting input of a respective one of the amplification elements. In other embodiments, each of the signal input nodes has a direct connection to the non-inverting input of a respective one of the amplification elements.

In some embodiments, the analog computation circuits described herein are employed in a vector signal decoder. As described above, the ENRZ vector code encodes three bits of information over four wires, using all possible permutations of the signal vectors $(+1, -\frac{1}{3}, -\frac{1}{3}, -\frac{1}{3})$ and $(-1, +\frac{1}{3}, +\frac{1}{3}, +\frac{1}{3})$. Where the voltages on the four wires are represented as (A, B, C, D), each of the analog computation circuits can decode one bit of the three-bit code by performing one of the operations described in Equations 2-4, above. Three such circuits operate in parallel on different permutations of the input voltages to return the values of $R_0$, $R_1$, and $R_2$. An exemplary vector signal decoder is illustrated in FIG. 9.

Mention of particular vector signaling codes such as ENRZ in the examples herein are made for purposes of explanation, and are not limiting. Circuits and circuit design elements described herein may be utilized to amplify, equalize, and/or detect signals representing other codes. One familiar with the art will recognize that circuits and circuit design elements described herein may be readily combined with known art to produce further embodiments of the invention.

I claim:

1. A circuit for continuous time linear equalization of analog signals and analog computation, comprising:
   a first amplification element and a second amplification element with matched characteristics in a differential configuration, each amplification element having a first input and a second input,
   a first load impedance for the first amplification element and a second load impedance for the second amplification element,
   a first signal input and a second signal input, each directly connected to a first input of the corresponding first and second amplification elements, and
   a third signal input connected to the second input of the second amplification element and a fourth signal input connected to the second input of the first amplification element.

2. The circuit of claim 1, wherein the first and second amplification elements comprise MOS transistors, the first inputs representing a common source configuration and the second inputs representing a common gate configuration.

3. The circuit of claim 2, wherein the first and second amplification elements further comprise sets of complimentary MOS transistors.

4. The circuit of claim 1, wherein the connections of the third and fourth signal inputs comprise at least a series capacitance.

5. A circuit for continuous time linear equalization of analog signals and analog computation, comprising:
   a first amplification element and a second amplification element with matched characteristics in a differential configuration, each amplification element having a first input and a second input,
   a third amplification element and a fourth amplification element with matched characteristics in a differential configuration, each amplification element having a first input and a second input,
   a first load impedance shared by the first amplification element and third amplification element, and a second load impedance shared by the second amplification element and fourth amplification element,
   a first, second, third, and fourth signal input, each directly connected to a first input of the corresponding first, second, third, and fourth amplification elements, respectively, and
   a frequency-dependent connection of the first, second, third, and fourth signal inputs to the second input of the fourth, third, second, and first amplification elements, respectively.

6. The circuit of claim 5, wherein the first, second, third, and fourth amplification elements comprise MOS transistors, the first inputs representing a common source configuration and the second inputs representing a common gate configuration for each amplification element.

7. The circuit of claim 6, wherein the first, second, third, and fourth amplification elements further comprise sets of complimentary MOS transistors.

8. The circuit of claim 5, wherein the frequency-dependent connections comprise at least a series capacitance.

9. A circuit comprising:
   a first, second, third, and fourth transistor, each of the transistors having a drain, a gate, and a source, wherein the first and second transistors are arranged in a first differential amplifier pair, and the third and fourth transistors are arranged in a second differential amplifier pair;
   a capacitive coupling between the gate of the first, second, third, and fourth transistor to the source of the second, first, fourth, and third transistor, respectively;
   a first output node coupled to the drain of the first transistor and to the drain of the third transistor; and
   a second output node coupled to the drain of the second transistor and to the drain of the fourth transistor.

10. The circuit of claim 9, wherein the first, second, third and fourth transistors are components of a first, second, third, and fourth CMOS transistor pairs.

11. A circuit comprising:
    a first, second, third, and fourth transistor, each of the transistors having a drain, a gate, and a source, wherein the first and second transistors are arranged in a first differential amplifier pair, and the third and fourth transistors are arranged in a second differential amplifier pair;
    a capacitive coupling between the gate of the first, second, third, and fourth transistor to the source of the fourth, third, second, and first transistor, respectively;
    a first output node coupled to the drain of the first transistor and to the drain of the third transistor; and
    a second output node coupled to the drain of the second transistor and to the drain of the fourth transistor.

12. The circuit of claim 11, wherein the first, second, third and fourth transistors are components of a first, second, third, and fourth CMOS transistor pairs.

13. An analog computation circuit comprising:
    a plurality of amplification elements arranged in a plurality of differential pairs, each differential pair including a first and second amplification element, and each of the amplification elements having an inverting input and a non-inverting input;
    a first and a second differential summing output node, an output of each of the first amplification elements being connected to the first summing output node, and an output of each of the second amplification elements being connected to the second summing output node;
    a first plurality of gain-enhancing capacitive couplings, each of the first plurality of couplings connecting the inverting input of one of the first amplification elements with the non-inverting input of one of the second amplification elements; and
    a second plurality of gain-enhancing capacitive couplings, each of the second plurality of couplings connecting the inverting input of one of the second amplification elements with the non-inverting input of one of the first amplification elements.

14. The circuit of claim 13, further comprising a plurality of signal input nodes, wherein each of the input nodes has a direct connection to the inverting input of a respective amplification element.

15. The circuit of claim 13, further comprising a plurality of signal input nodes, wherein each of the input nodes has a direct connection to the non-inverting input of a respective amplification element.

16. The circuit of claim 13, wherein each of the inverting inputs of the first amplification elements is connected through one of the first plurality of capacitive couplings with the non-inverting input of a respective second amplification element, and each of the inverting inputs of the second amplification elements is connected through one of the second plurality of capacitive couplings with the non-inverting input of a respective first amplification element.

17. The circuit of claim 13, wherein each of first and second plurality of capacitive couplings is connected between amplification elements in the same differential pair.

18. The circuit of claim 13, wherein each of the first and second plurality of capacitive couplings is connected between amplification elements in different differential pairs.

19. A vector signal decoder comprising a plurality of analog computation circuits according to claim 13.

* * * * *